United States Patent [19]

McClure

[11] Patent Number: 5,708,789
[45] Date of Patent: Jan. 13, 1998

[54] STRUCTURE TO UTILIZE A PARTIALLY FUNCTIONAL CACHE MEMORY BY INVALIDATION OF FAULTY CACHE MEMORY LOCATIONS

[75] Inventor: David Charles McClure, Carrollton, Tex.

[73] Assignee: SGS-Thomson Microelectronics, Inc., Carrollton, Tex.

[21] Appl. No.: 717,139

[22] Filed: Sep. 20, 1996

Related U.S. Application Data

[63] Continuation of Ser. No. 146,228, Nov. 1, 1993, abandoned.

[51] Int. Cl.$^6$ ...................................................... G06F 12/08
[52] U.S. Cl. .................. 395/403; 395/181; 395/182.01; 395/183.01; 395/445; 395/465; 395/471; 364/243.43; 364/245.3; 364/964.21
[58] Field of Search ........................ 395/181, 182.01, 395/183.01, 403, 445, 465, 471; 364/243.43, 245.3, 964.21

[56] References Cited

U.S. PATENT DOCUMENTS

| | | | |
|---|---|---|---|
| 4,168,541 | 9/1979 | DeKarske | 365/230 |
| 4,298,929 | 11/1981 | Capozzi | 364/200 |
| 4,357,656 | 11/1982 | Saltz et al. | 364/200 |
| 4,991,081 | 2/1991 | Bosshart | 364/200 |
| 4,996,641 | 2/1991 | Talgam et al. | 364/200 |
| 5,019,971 | 5/1991 | Lefsky et al. | 364/200 |
| 5,195,096 | 3/1993 | Moore | 371/21.1 |
| 5,201,041 | 4/1993 | Bohner et al. | 395/425 |
| 5,226,150 | 7/1993 | Callander et al. | 395/575 |
| 5,263,032 | 11/1993 | Porter et al. | 371/40.2 |
| 5,283,876 | 2/1994 | Tague | 395/400 |
| 5,551,004 | 8/1996 | McClure | 395/465 |

Primary Examiner—Jack B. Harvey
Assistant Examiner—Valerie Darbe
Attorney, Agent, or Firm—Theodore E. Galanthay; Lisa K. Jorgenson; Renee M. Larson

[57] ABSTRACT

According to the present invention, when faulty data bits in a cache memory are not repairable through conventional repair means such as row/column redundancy, the faulty bits are made inaccessible to the microprocessor by rendering invalid an appropriate line of data in the cache memory containing the faulty data. The present invention employs address detection circuitry which detects when a faulty data address stored in the tag RAM is presented during a microprocessor memory cycle and forces the valid bit for that faulty data to a predetermined logic level. When the valid bit associated with the faulty data is set to the predetermined logic level, the tag RAM generates a signal indicative of a "miss" condition. The "miss condition" is communicated to the microprocessor which must access the requested data from main memory, thus effectively bypassing the faulty data. The address detection circuitry of the invalidation circuitry may be expanded to handle any number of faulty data. In this way, a primary or secondary cache memory having faulty data may be utilized.

15 Claims, 1 Drawing Sheet

STRUCTURE TO UTILIZE A PARTIALLY FUNCTIONAL CACHE MEMORY BY INVALIDATION OF FAULTY CACHE MEMORY LOCATIONS

This is a Continuation of application Ser. No. 08/146,228, filed Nov. 1, 1993 now abandoned.

BACKGROUND OF THE INVENTION

1. Field of the Invention

The present invention relates generally to integrated circuit memory devices, and more specifically to a structure for utilizing a partially functional cache memory by invalidating faulty cache memory locations.

2. Description of the Prior Art

During the manufacture of integrated circuit memory devices, die are often discarded when certain bits of the die are defective but not easily identified and repaired at, for instance, laser repair. Even though a majority of the die may be fully functional, it is often necessary to discard the entire die if the unfunctional bits of the die are not repairable. This problem is exacerbated when a memory device is embedded in another, more expensive device such as a microprocessor or an application specific integrated circuit (ASIC). It is undesirable to discard a costly microprocessor because the memory embedded in it has faulty bits. Memories which may have faulty bits include cache memories, memory cards, and memories embedded in ASICs.

Cache memories are important elements of the typical cache system and are increasingly used as primary caches embedded in high performance microprocessors or as secondary caches external to the microprocessor. As microprocessors have achieved faster operating speed, the rate at which requested data must be supplied to them has correspondingly increased. Cache memories typically have faster access time than main memory and thus are often used to quickly supply data requested by the microprocessor. The tag associated with a "line" of data, a block of data which can be one or several consecutive bytes or words of data, in the cache memory is stored in a tag RAM which holds the address locations of data stored in the data cache. The tag RAM often has a valid bit which indicates whether data stored at a particular address location is valid or invalid. When the microprocessor requests information, a read signal is sent to both the main memory and the tag RAM. The tag RAM compares the requested memory address with the memory address of all data stored in the cache memory. If the requested memory address is in the tag RAM, a "hit" condition exists, and data from that location will be gated from the cache memory to the microprocessor.

In a "hit" condition, the tag RAM generates a valid compare Match output signal and the cache memory gates the required data onto the data bus before the main memory can respond. In this way, the cache memory quickly supplies data to the microprocessor and microprocessor wait states are avoided. However, if the tag RAM's comparison operation indicates that the desired data is not stored inside the cache memory, a "miss" condition exists, and the data must come from main memory which typically holds more data than the cache memory and is therefore much slower. As a result, the microprocessor may have to wait for several cycles, during which time it is idle, before receiving requested data from main memory. These unproductive cycles are referred to as "wait states" since the microprocessor must wait until the requested data is provided from main memory.

A cache memory having randomly occurring bit(s) failures is often discarded. Unfortunately, memory devices may suffer from incidences of bit failures due to randomly occurring process problems such as particle contamination. These failures may not be easily repaired, especially if no row or column redundancy testing is employed. Even when redundancy testing at laser repair is used, this technique may not be sufficient to ferret out all bit failures. Therefore, when a cache memory having bit(s) failures is resident in microprocessors, ASICs, or other devices, both the faulty cache memory and the expensive fully functional device in which it is embedded are often discarded. Therefore, there is a current need in the art to compensate for random bit(s) failures in cache memories such that cache memories having faulty bits are rendered usable. It would be desirable to bypass defective data locations in the cache memory such that the cache memory and any device in which it is embedded is not scrapped.

SUMMARY OF THE INVENTION

It would be advantageous in the art to bypass faulty bit locations in a cache memory so as to render a partially functional cache memory usable.

Therefore, according to the present invention, when faulty data bits in a cache memory are not repairable through conventional repair means such as row/column redundancy, the faulty bits are made inaccessible to the microprocessor by rendering invalid an appropriate line of data in the cache memory containing the faulty data. The present invention employs address detection circuitry which detects when a faulty data address stored in the tag RAM is presented during a microprocessor memory cycle and forces the valid bit for that faulty data to a predetermined logic level. When the valid bit associated with the faulty data is set to the predetermined logic level, the tag RAM generates a signal indicative of a "miss" condition. The "miss condition" is communicated to the microprocessor which must access the requested data from main memory, thus effectively bypassing the faulty data. The address detection circuitry of the invalidation circuitry may be expanded to handle any number of faulty data. In this way, a primary or secondary cache memory having faulty data may be utilized.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

During the manufacture of cache memory devices, random bit failures are often caused by process problems such as particle contamination. These failures, if not identified and corrected, can render an otherwise functional cache memory unusable, including a primary cache memory which is embedded in the microprocessor of a cache system. In this case, random process defects can result in the scrapping of not only the primary cache memory, but also the fully functional microprocessor as well. Therefore, the present invention addresses this problem by invalidating and bypassing faulty bits such that a partially functional cache memory may still be utilized.

Figure 1:
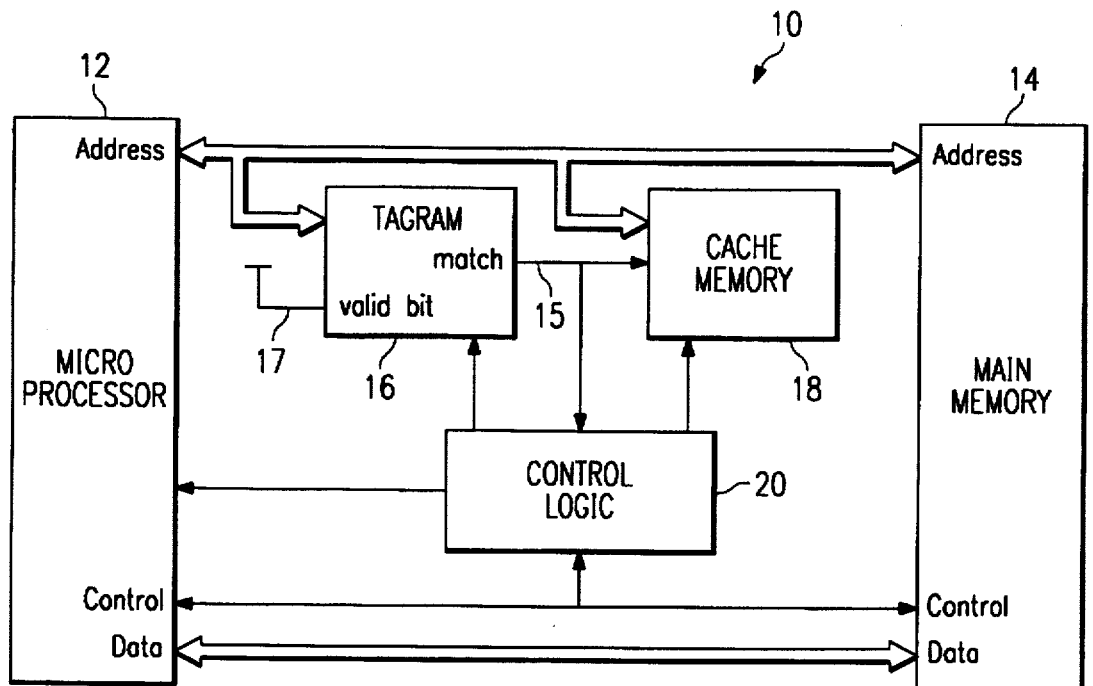
FIG. 1 is a block diagram of a cache system according to the prior art.

FIG. 1 shows a block diagram of a cache system according to the prior art. A typical cache system 10 is comprised of five main elements: microprocessor 12, main memory 14, tag RAM 16, cache memory 18, and control logic 20. Because the cache memory is separate from the microprocessor, cache system 10 is a secondary cache system and has been shown for clarity. In a primary cache system, cache memory is embedded in the microprocessor, and therefore is sometimes called an embedded cache memory. Microprocessor 12 could obtain all needed data from the slow main memory 14. However, since main memory 14 is typically much slower than microprocessor 12, microprocessor 12 will incur "wait states" until the data arrives from main memory 14. During wait states, microprocessor 12 is idle. Wait states have a negative impact on the efficiency of the processor and, therefore, on computer performance.

For these reasons, a cache system is used to provide the microprocessor with data in a more timely fashion, in the hopes of reducing or even eliminating microprocessor wait states. The secondary cache system, composed of tag RAM 16, cache memory 18, and control logic 20, resides between microprocessor 12 and main memory 14. Smaller and faster than main memory 14, cache memory 18 stores a copy of frequently accessed main memory data. Storing data commonly accessed by the microprocessor 12 increases the likelihood that cache memory 18 will have the requested data in the event of a microprocessor memory cycle.

Transparent to main memory 14, cache memory 18 supplies data to microprocessor 12 upon a microprocessor read cycle if it has the requested data. Tag RAM 16 determines if cache memory 18 has the data requested by the microprocessor 12. Tag RAM 16 stores the memory addresses of data stored in cache memory 18. Valid bit 17 of tag RAM 16 indicates whether the data stored at a particular address location is valid or invalid. The valid bits of address locations stored in the tag RAM 16 are typically cleared by resetting the value of the valid bit for all address locations in the tag RAM through software or hardware means at the start of a new process or program. Valid bit 17 is tied to a logic high voltage level, $V_{CC}$, as shown in FIG. 1, such that subsequent write cycles from microprocessor 12 write a "one" to newly written tag RAM address locations. Until microprocessor 12 writes data to a cache memory location, the valid bit 17 for that address location will be invalid or equal to a logic low level.

Upon a microprocessor read, the tag RAM 16 compares the address of the data being sought with the addresses of data stored in the cache memory 18. If a "hit" or match condition exists and the valid bit 17 for that address location is valid, the tag RAM 16 generates a logic high Match output signal 15 which indicates that cache memory 18 has the desired data. Data from cache memory 18 is then gated onto the data bus where it is received by microprocessor 12. If, however, tag RAM 16 determines the desired data address does not match any addresses stored in the cache memory 18, a "miss" condition exists. Or, if the desired data address matches an address stored in cache memory 18 but valid bit 17 for that address is invalid, a "miss" condition also exists. In response to a "miss" condition, tag RAM 16 generates a logic low Match output signal.

Once tag RAM 16 has determined if cache memory 18 contains the data of the memory address being requested and that the data is valid, it generates Match output signal 15. Match output signal 15 is an input signal to cache memory 18 and functions as a high-speed chip select which allows or does not allow data from the cache memory to be gated onto the data bus to the microprocessor. If the tag RAM comparison function indicates a "hit" condition then the cache memory outputs are simply enabled. If a "miss" condition is indicated, the outputs of the cache memory 18 are not enabled and main memory 14 will ultimately supply the data to the microprocessor 12. When a "miss" occurs, the unnecessary read does not cause problems because the contents of the cache memory location are typically updated with the requested data. This parallel activity during cache memory read cycles saves time and can possibly allow the data to be read by microprocessor 12 in a single cycle, with no wait states.

According to the present invention, a faulty bit in the tag RAM or data cache of the cache memory is identified and an entire line of data containing the faulty bit is invalidated through the valid bit for the address which corresponds to the faulty bit. Invalidation of a faulty bit makes an entire line of data in the cache memory, either the data cache or the tag RAM, inaccessible to the microprocessor such that the requested data must be supplied by main memory, effectively bypassing the faulty bit and the associated line of data. The tag RAM is used to control access to particular data. If a faulty bit is not repaired using conventional repair techniques such as row/column redundancy, the tag RAM may be programmed with the address of the faulty data bit or tag bit such that when the microprocessor requests data at that address, the invalid bit corresponding to that address will be set to an invalid state and will cause the tag RAM to generate a signal indicative of a "miss" condition. This miss condition is communicated to the microprocessor which will access the requested data from main memory.

Figure 2:
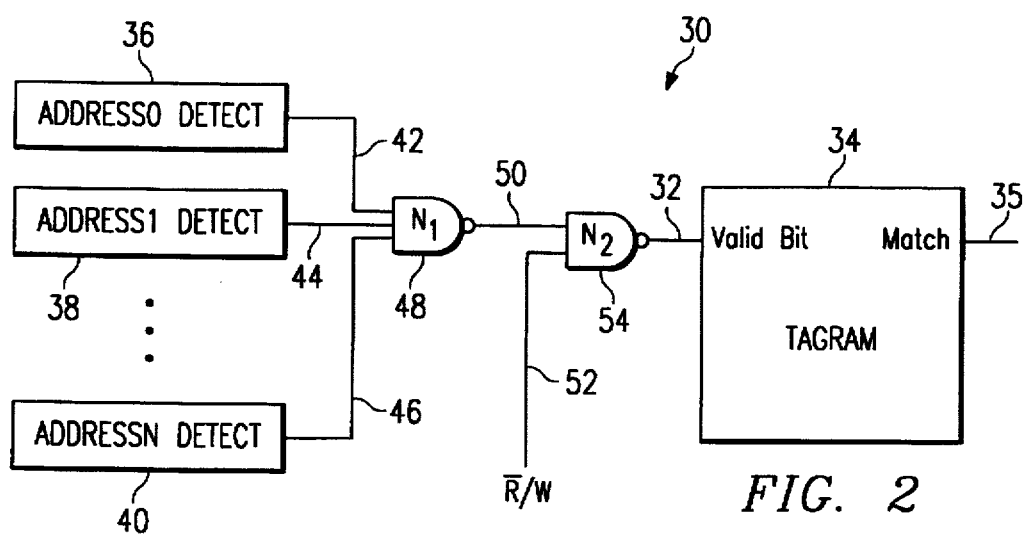
FIG. 2 is a schematic diagram of circuitry used to invalidate and bypass a faulty cache memory bit according to the present invention.

Circuitry used to invalidate and thus bypass a line of data having a faulty bit according to the present invention is shown in FIG. 2. Invalidation circuitry 30 determines whether valid bit 32 of tag RAM 34 will be equal to a valid or an invalid logic level for a particular address. Address0 Detect block 36, Address1 Detect Block 38, and AddressN Detect block 40 allow up to N addresses of known faulty bits to be programmed into invalidation circuitry 30. Output signals 42, 44, and 46 of Address0 Detect block 36, Address1 Detect block 38, AddressN Detect block 40, respectively, are input to N1 NAND gate 48 which generates signal 50 as its output. Signal 50 is one of two input signals to N2 NAND gate 54; the second input signal is R/N read and write signal 52.

Read and write signal R/W 52 is equal to a low logic level during a microprocessor compare or read cycle and is equal to a high logic level during a microprocessor write cycle. During a write cycle, read and write signal 52 is equal to a high logic level and, if at least one of the output signals 42, 44, or 46 of address detect blocks 36, 38, or 40 is equal to a logic low, then a faulty bit address has been detected. Valid bit 32 is forced to a logic low level and an invalid state is written into the tag RAM for that faulty bit address. Thus, when the microprocessor during a read cycle presents an address which corresponds to a faulty bit, the value of valid bit 32 for this faulty address is forced to a high logic level due to read and write signal R/W 52 being a logic low level, and tag RAM 34 generates a match signal 35 indicative of a "miss" condition. Generation of this "miss" signal guarantees that the microprocessor must obtain the required data from main memory. Thus, invalidation circuitry insures that an entire data line containing faulty bits is bypassed and therefore not provided to the microprocessor.

The address detect blocks 36, 38, and 40 shown in FIG. 2 may be composed of a variety of circuitry well known in the art. For instance, address detect circuitry may be fuse-based or it may be register-based where the registers are loaded according to built-in self test (BIST) capabilities. Additionally, address detect circuitry need not introduce additional circuitry to the tag RAM compare logic, and thus additional delays are not introduced to the compare logic of the tag RAM. The address detect circuitry may be positioned deep inside the tag RAM far away from external pads so as not to impede write cycle timing.

It may be advantageous to partition the memory with bits of an associated address physically adjacent to each other, such as DQ0, 1, 2, 3, 4, etc., and not with bits associated with a DQ physically adjacent such as all DQ0 bits together, then all DQ1 bits together, etc. In this way, adjacent cell failures are more likely to be covered by a single faulty address and not by several faulty addresses. This is particularly true in the tag RAM, but may not necessarily be true in the cache memory, if the adjacent cells are grouped in a cache line. This is because an entire data line is associated with the tag entry.

The above process of invalidation of addresses corresponding to faulty bits renders an effectively smaller cache memory by the number of faulty locations that are bypassed. Random faulty bits are not likely to be numerous after redundancy testing has been exhausted. However, any resulting performance degradation may be imperceptible since there will typically be only a relatively small percentage of available addresses which are invalidated and bypassed. Depending on the number of defects which render isolated bits uncacheable, only a very small portion of the total tag data entries will be inaccessible. As an example, a tag RAM with 16K data entries and one defect will only suffer approximately a 0.0061% degradation in the number of valid tag entries and data locations in the cache memory.

For a set-associative cache, performance degradation may be even smaller, because a microprocessor has two or more "sets" from which to obtain data. Thus, if one set has an invalidated address for the requested data, another set may very well be able to provide valid data. In a two-way set-associative cache system, for example, the cache is split into two smaller, somewhat independent caches. This allows for two tags to be stored for a given index address and the two associated lines of data in each cache memory; the index of the tag is the least significant bits (LSBs) of the address field, used to address a given tag location. Set-associative cache systems typically possess higher hit rates than a comparable direct mapped cache, although there is some added complexity, embodied in replacement algorithms which determine what cache location of which tag RAM to overwrite upon a miss condition. The present invention, then, allows larger cache memories to be used without worrying about the greater number of faulty data bits which may be present in a larger cache memory.

The present invention provides circuitry which invalidates and bypasses faulty data bits. When an address corresponding to a faulty bit has been identified, that address is programmed into the tag RAM invalidation circuitry which forces the tag RAM to generate a Match signal indicative of a "miss" condition when data at that address is requested during a microprocessor read cycle. The cache memory data corresponding to a faulty tag RAM address will not be allowed to be supplied to the microprocessor. An otherwise fully functional cache memory, either embedded or secondary, having bit(s) failures or other failure mechanisms may be utilized with the present invention. Other types of failure mechanisms may include multiple bit failures, a locked row, or a locked column. ASICs and microprocessors, having embedded partially functional cache memory, or external cache memory may be salvaged. Improving memory device yield will become more important as larger cache memories are embedded in microprocessors as primary cache; improved memory yield will allow expensive microprocessors to be salvaged with little or no performance degradation. Also, the present invention allows for increased memory density in a cache system, such as more primary cache memory embedded in a microprocessor, because every bit in the cache memory need not be fully functional for the cache system to operate at an acceptable level.

While the invention has been particularly shown and described with reference to a preferred embodiment, it will be understood by those skilled in the art that various changes in form and detail may be made therein without departing from the spirit and scope of the invention.

What is claimed is:

1. Circuitry for invalidating faulty data locations in a cache memory, comprising:

a tag RAM which stores a plurality of addresses corresponding to data stored in the cache memory and which has a valid bit input and a match output; and invalidation circuitry which invalidates an address of the plurality of addresses corresponding to a faulty bit stored in the cache memory by controlling the value of the valid bit input for the address, such that upon a memory cycle no data stored at the address may be retrieved, wherein the invalidation circuitry further comprises:

a plurality of address detect blocks wherein each address detect block generates an address detect signal if an address unique to the address detect block which corresponds to faulty cache memory data is detected;

a first logic gate which has inputs equal to the address detect signals generated by the address detect blocks and which generates a final address detect signal; and a second logic gate which has a first input equal to the final address detect signal and a second input equal to the read/write signal and which generates the valid bit input of the tag RAM.

2. The circuitry of claim 1, wherein when an address corresponding to faulty cache memory data is presented to the invalidation circuitry during a write cycle, the valid bit input is forced to a predetermined logic state such that during a read cycle the match output of the tag RAM to be indicative of a "miss condition" and the faulty cache memory data is bypassed.

3. The circuitry of claim 2, wherein the faulty cache memory data is bypassed when the match output indicative of a "miss" condition is received by a microprocessor which has requested the invalid cache memory data.

4. The circuitry of claim 2, wherein the invalidation circuitry is controlled by a read/write signal.

5. The circuitry of claim 1, wherein the plurality of address detect blocks are fuse based.

6. The circuitry of claim 1, wherein the plurality of address detect blocks are register based.

7. The circuitry of claim 6, wherein built-in-self-test (BIST) circuitry loads the addresses of faulty cache memory data into the address detect blocks.

8. The circuitry of claim 1, wherein the cache memory is a primary cache memory.

9. The circuitry of claim 8, wherein the cache memory is embedded in a microprocessor.

10. The circuitry of claim 8, wherein the cache memory is embedded in a application specific integrated circuit (ASIC).

11. A method for invalidating and bypassing faulty data locations in a cache memory, comprising the steps of:

programming an address corresponding to a faulty cache memory data into invalidation circuitry which controls the value of a valid bit input of a tag RAM;

detecting the address corresponding to the faulty cache memory data upon a memory cycle from a microprocessor;

invalidating the address, through the invalidation circuitry, by setting the valid bit of the tag RAM for the address to a predetermined logic state; and bypassing the address corresponding to the faulty cache memory data when the tag RAM generates a match output signal indicative of a "miss condition" in response to setting the valid bit of the tag RAM to a predetermined logic state.

12. The method of claim 11, wherein the step of detecting the address corresponding to faulty data memory data further comprises the steps of:

generating an address detect signal for each address detect block of a plurality of address detect blocks if an address unique to the address detect block which corresponds to faulty cache memory data is detected; and generating a final address detect signal by a first logic gate which has inputs equal to the address detect signals generated by the address detect blocks.

13. The method of claim 11, wherein invalidating the address by setting the valid bit of the tag RAM to a predetermined logic state comprises the step of:

setting fuses of the invalidation circuitry.

14. The method of claim 11, wherein invalidating the address by setting the valid bit of the tag RAM to a predetermined logic state comprises the step of:

loading registers of the invalidation circuitry.

15. The method of claim 14, wherein loading registers of the invalidation circuitry comprises the step of:

loading the addresses of faulty cache memory data into the registers, wherein loading is accomplished by built-in-self-test (BIST) circuitry.

* * * * *